US010000847B2

(12) United States Patent
Rao et al.

(10) Patent No.: US 10,000,847 B2
(45) Date of Patent: Jun. 19, 2018

(54) GRAPHITE SUSCEPTOR

(71) Applicant: Applied Materials, Inc., Santa Clara, CA (US)

(72) Inventors: Preetham Rao, Bangalore (IN); Subramani Iyer, San Jose, CA (US); Kartik Shah, Sunnyvale, CA (US); Mehran Behdjat, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 330 days.

(21) Appl. No.: 14/863,063

(22) Filed: Sep. 23, 2015

(65) Prior Publication Data

US 2016/0083840 A1    Mar. 24, 2016

(30) Foreign Application Priority Data

Sep. 24, 2014 (IN) .............................. 4662CHE2014

(51) Int. Cl.
| H05B 3/68 | (2006.01) |
| C23C 16/00 | (2006.01) |
| C23C 16/458 | (2006.01) |
| H01L 21/687 | (2006.01) |
| H01L 21/67 | (2006.01) |

(52) U.S. Cl.
CPC ...... *C23C 16/4583* (2013.01); *C23C 16/4581* (2013.01); *H01L 21/67098* (2013.01); *H01L 21/68785* (2013.01)

(58) Field of Classification Search
CPC .......... H01J 37/32477; H01J 37/32715; H01L 21/67098–21/67115; H01L 21/6831; H01L 21/68785; C23C 16/458–16/4583
USPC .................... 219/443.1–468.2; 118/724, 725
See application file for complete search history.

(56) References Cited

U.S. PATENT DOCUMENTS

| 5,462,603 A * | 10/1995 | Murakami ........... C23C 16/4586 118/719 |
| 6,143,079 A * | 11/2000 | Halpin ................ C23C 16/4584 118/620 |
| 7,718,930 B2 * | 5/2010 | Kawasaki ........... C23C 16/4581 118/728 |
| 2004/0261946 A1 * | 12/2004 | Endoh ............... H01J 37/32082 156/345.15 |
| 2006/0096946 A1 * | 5/2006 | Schaepkens ...... H01L 21/67103 216/13 |
| 2010/0193501 A1 * | 8/2010 | Zucker ............. H01L 21/67248 219/443.1 |

\* cited by examiner

*Primary Examiner* — Sang Y Paik
(74) *Attorney, Agent, or Firm* — Patterson + Sheridan LLP

(57) ABSTRACT

Embodiments described herein include a susceptor for semiconductor processing including an oriented graphite plate that may have a thickness of at least 1 mm. The susceptor may have a support member, and the oriented graphite plate may be disposed on the support member. The support member may have a center thermal conduit and an edge thermal conduit, and may be substantially solid between the center thermal conduit and the edge thermal conduit.

17 Claims, 2 Drawing Sheets

GRAPHITE SUSCEPTOR

CROSS-REFERENCE TO RELATED APPLICATIONS

This application claims benefit of Indian Provisional Patent Application Serial No. 4662/CHE/2014 filed Sep. 24, 2014, which is incorporated herein by reference.

FIELD

Embodiments of the present disclosure generally relate to methods and apparatus for semiconductor processing. More specifically, embodiments described herein relate to methods and apparatus for performing atomic layer epitaxy.

BACKGROUND

Temperature non-uniformity is a major design challenge in the design of Rapid Thermal Processing chambers. Temperature uniformity between 5° C. and 10° C. across a substrate is helpful in achieving a high quality of deposition or annealing all around the substrate. In this regard, temperature uniformity is defined as the difference between a maximum temperature measured at any point on a substrate and a minimum temperature measured concurrently at any point on the substrate. The substrate may be heated using conductive heaters or radiation. Several methods are conventionally used to control temperature uniformity of a substrate during processing, including use of reflective and/or absorptive shields, liners, specially designed coil layout inside the heater, and power supply control. Despite these measures, temperature uniformity still remains a major issue. Non-uniformity may result because of the differential heating of a substrate from the heater below.

Therefore, there exists a need for a susceptor that provides improved temperature uniformity of a substrate during thermal processing.

SUMMARY

Embodiments described herein provide a substrate support, comprising a support member; and an oriented graphite plate having a thickness of about 1 mm to about 10 mm disposed on the support member.

Other embodiments described herein provide a substrate support, comprising a support member; and a substrate support surface disposed on the support member, the substrate support surface comprising an oriented graphite plate having a thickness of about 1 mm to about 10 mm disposed within an outer member.

Other embodiments described herein provide a substrate support, comprising a susceptor having low thermal mass; and an oriented graphite plate disposed in a recess in contact with the susceptor, wherein the oriented graphite plate has a thickness between about 1 mm and about 10 mm and a substrate contact surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Oriented graphite surfaces may be used in substrate supports for thermal processing of semiconductor substrates to promote temperature uniformity across the substrate. Embodiments described herein include a substrate support for semiconductor processing including a heat spreading surface made of oriented graphite. The heat spreading surface is a surface that would contact or be in close proximity to a semiconductor substrate during processing to transfer thermal energy to the semiconductor substrate. The heat spreading surface is a surface of a graphite plate that may have a thickness of 1 mm or more. The graphite plate is made using a carbon pyrolysis process to build the plate by layers of graphite. Often called "pyrolytic graphite", such a material has thermal conductivity along the graphite layers that is at least 100 times the thermal conductivity across the layers.

Figure 1:
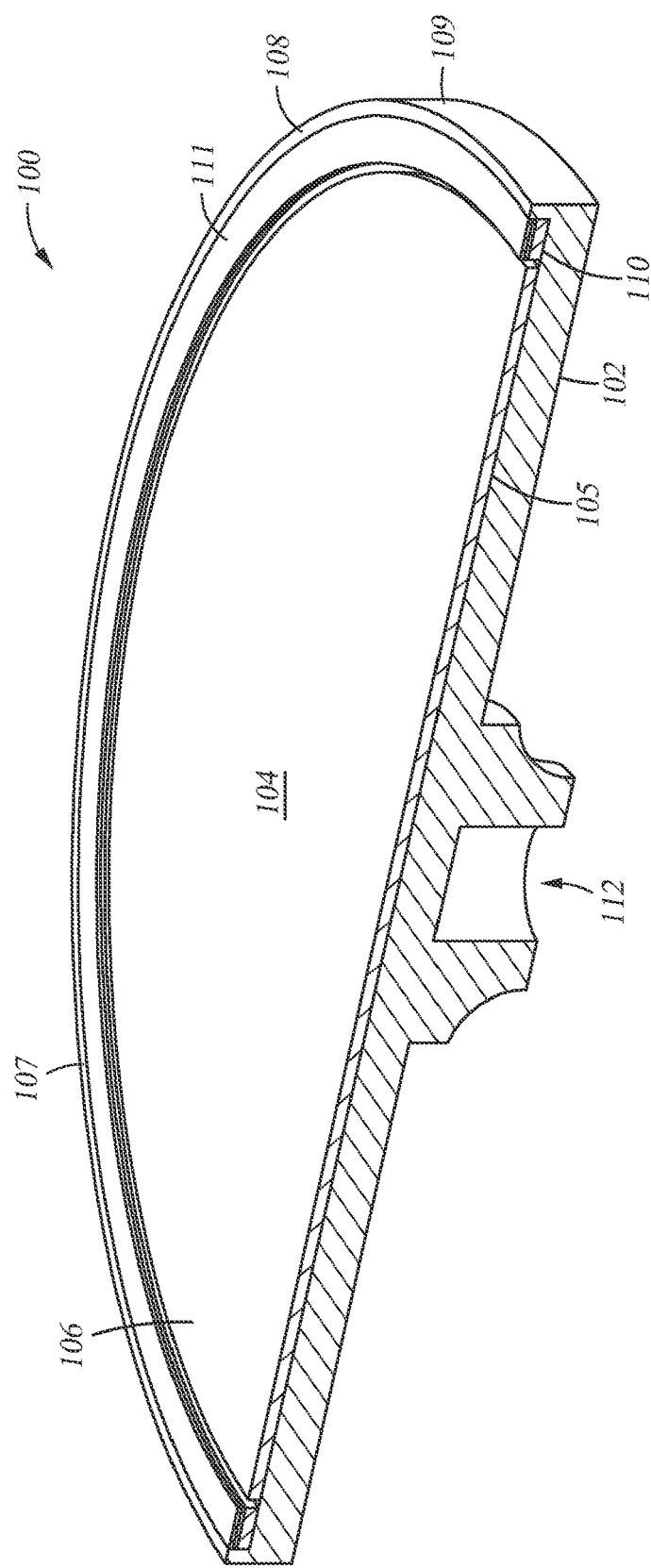
FIG. 1 is a cutaway view of a substrate support according to one embodiment.

FIG. 1 is a cutaway view of a substrate support 100 according to one embodiment. The substrate support 100 has a support member 102 on which an oriented graphite plate 104 is disposed. The oriented graphite plate 104 may have a thickness of about 1 mm to about 10 mm, for example about 4 mm. The oriented graphite plate is in contact with a heat transfer surface 105 of the support member 102, which may be made of a thermally conductive material such as aluminum or aluminum nitride, or another metal.

The support member 102 may have a rim 108 at an edge 109 of the support member 102. The rim 108 may define a recess 106 in which the oriented graphite plate 104 is disposed. The recess 106 may have a depth substantially equal to the thickness of the oriented graphite plate 104, such that a contact surface 106 of the oriented graphite plate 104 is substantially coplanar with an upper surface 107 of the rim 108. A ring 111 may be disposed on the heat transfer surface 105 inward of the rim 108. The ring 111 may be used for edge thermal control of a substrate disposed on the substrate support 100.

The ring 111 may include an edge conduit 110. The edge conduit 110 may be a thermal conduit for housing a thermal control medium. The thermal control medium may be used to control thermal state at an edge of a substrate disposed on the contact surface 106. The thermal control medium may be a fluid that is circulated through the edge conduit 110, for example a liquid or gas, or the thermal control medium may be a solid material, such as a resistive heater or a heat sink member, disposed in the edge conduit 110.

The support member 102 may be a susceptor, which may be heated by radiant or conductive means. In one embodiment, the support member 102 is made of silicon and carbon in any desired proportion. The support member 102 may be silicon carbide, or another mixture of silicon and carbon, which may be a molecular mixture, an alloy, or a structured mixture such as silicon carbide coated silicon or silicon carbide coated graphite. In other embodiments, the support member 102 may be ceramic, such as alumina, or metal, such as aluminum.

The support member 102 may have a center conduit 112 near a center of the support member 102. The center conduit 112 may have an annular cross-sectional shape. The center conduit 112 may be used generally to provide energy to the support member 102. For example, power for resistive heating, or thermal fluids for conductive heating or cooling, may be provided through the center conduit 112.

In the embodiment of FIG. 1, the oriented graphite plate 104 is shown in contact with the support member 102. In other embodiments, a separation layer may be disposed between the support member 102 and the oriented graphite plate 104. The separation layer may be a coating to prevent contact between the oriented graphite plate 104 and the support member 102, if desired.

Figure 2:
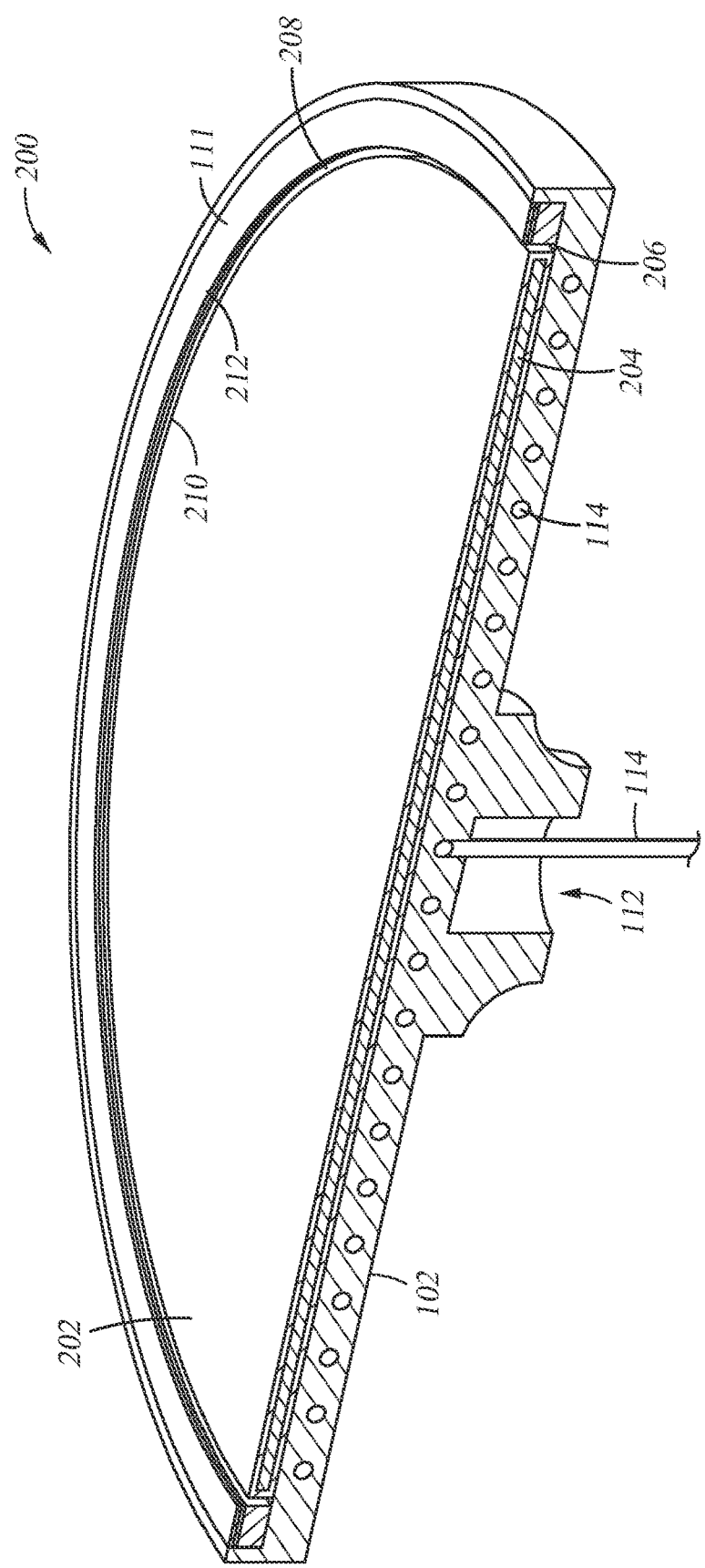
FIG. 2 is a cutaway view of a substrate support according to another embodiment.

FIG. 2 is a cutaway view of a substrate support 200 according to another embodiment. The substrate support 200 is generally similar to the substrate support 100, except as described below. The substrate support 200 has a center conduit 112 similar to the substrate support 100. The center conduit 112 may include a passage that couples the center conduit 112 to a surface of the support member 102 for vacuum chucking a substrate to the oriented graphite plate 104. The center conduit 112 may be a thermal conduit for routing a thermal control element 114. The thermal control element 114 may be a resistive heater, a heat sink, or a heating or cooling fluid circulated through the conduit 112. The support member 102 may be substantially solid between the center thermal conduit 112 and the edge thermal conduit 110, or the support member 102 may have a thermal element, such as the thermal control element 114, distributed throughout, for example in a spiral pattern through the support member 102. A plurality of such thermal elements may be included in the support member 102 to provide discrete thermal control zones. For example a first thermal control element may be located at and around the center of the support member 102 while a second thermal control element may be disposed around a periphery of the support member 102. The thermal control elements described above may be fluid elements that flow through the support member 102 or solid elements that may provide resistive or conductive heating. Due to the high thermal conductivity of the oriented graphite plate 104, temperature uniformity of a substrate disposed on the oriented graphite plate may be maintained at 5° C. or less, for example about 4° C.

The substrate support 200 has a support surface 202 that includes an oriented graphite plate 204 disposed within an outside member 206. The oriented graphite plate 204 may be encapsulated in the outside member 206, covered by the outside member 206, or sandwiched between two outside member 206. The outside member 206 may be made of a material that resist chemical attack from the processing environment used to process a substrate on the substrate support 200. For example, the outside member 206 may be a ceramic material, such as alumina or yttria. In other embodiments, the outside member 206 may be silicon, silicon-carbon, or silicon carbide. In still other embodiments, the outside member 206 may be metal, such as aluminum or titanium, or glass, such as silica, quartz, or a doped glass.

The outside member 206 is shown in FIG. 2 as a monolithic member, but the outside member 206 may also be a layered structure of different materials including any of the materials mentioned above.

The supporting surface 202 is generally disk-shaped in the substrate support 200, and may be removably disposed on the support member 102, adhered to the support member 102, or attached to the support member 102. A gap 208 may be provided between a periphery 210 of the supporting surface 202 and an inner radius 212 of the ring 111. The gap 208 may be used to manage processing conditions near an edge region of a substrate disposed on the supporting surface 202, for example by flowing a gas or other fluid in the gap 208. The oriented graphite plate 204 may have a thickness of about 1 mm to about 10 mm, for example about 4 mm, and the outside member 206 may have a thickness of about 10 μm to about 5 mm. Thus, the outside member 206 may be a coating on the oriented graphite plate 204 in some embodiments.

The outside member 206 may be formed completely around the oriented graphite plate 204, such that the oriented graphite plate 204 is enclosed by, or encapsulated by, the outside member 206, or the outside member 206 may sandwich the oriented graphite plate 204, such that the outside member 206 includes a first layer between the oriented graphite plate 204 and the support member 102 and a second layer over the oriented graphite plate 204 and forming a substrate contact surface. Alternately, the outside member 206 may be a layer over the oriented graphite plate 204, where the oriented graphite plate 204 is in contact with the support member 102.

While the foregoing is directed to embodiments of the present invention, other and further embodiments of the invention may be devised without departing from the basic scope thereof, and the scope thereof is determined by the claims that follow.

What is claimed is:

1. A substrate support, comprising:
   a support member for vacuum chucking a substrate comprising a thermal conduit and a rim; and
   an oriented graphite plate disposed on the support member, wherein the oriented graphite plate comprises a plurality of layers of graphite and has:
      (a) a thickness of about 1 mm to about 10 mm,
      (b) a thermal conductivity along the graphite layers that is at least 100 times the thermal conductivity across the layers, and
      (c) an oriented graphite plate diameter substantially similar to a diameter of the rim.

2. The substrate support of claim 1, wherein the oriented graphite plate has a substrate contact surface.

3. The substrate support of claim 1, wherein the oriented graphite plate is disposed within an outside member.

4. The substrate support of claim 1, wherein the support member is a susceptor.

5. The substrate support of claim 3, wherein the outside member encapsulates the oriented graphite plate.

6. The substrate support of claim 3, wherein the outside member is resistant to chemical attack.

7. The substrate support of claim 1, wherein the support member comprises a center conduit and an edge thermal conduit.

8. The substrate support of claim 1, wherein the support member is solid between the center thermal conduit and the edge thermal conduit.

9. A substrate support, comprising:
   a support member for vacuum chucking a substrate comprising a thermal conduit and a rim; and
   a substrate support surface disposed on the support member, the substrate support surface comprising an oriented graphite plate disposed within an outer member, wherein the oriented graphite plate comprises a plurality of layers of graphite and has:
 (a) a thickness of about 1 mm to about 10 mm,
 (b) a thermal conductivity along the graphite layers that is at least 100 times the thermal conductivity across the layers, and
 (c) an oriented graphite plate diameter substantially similar to a diameter of the rim.

10. The substrate support of claim 9, wherein the support member is a susceptor.

11. The substrate support of claim 9, wherein the support member is a heater.

12. The substrate support of claim 9, wherein the outer member encapsulates the oriented graphite plate.

13. The substrate support of claim 9, wherein the outer member is a coating on the oriented graphite plate.

14. The substrate support of claim 12, wherein the outer member is ceramic.

15. A substrate support, comprising:
 a susceptor comprising a support member for vacuum chucking a substrate, the support member comprising a thermal conduit and a rim; and
 an oriented graphite plate disposed in a recess in contact with the susceptor, wherein the oriented graphite plate comprises a plurality of layers of graphite and has:
  (a) a thickness between about 1 mm and about 10 mm,
  (b) a thermal conductivity along the graphite layers that is at least 100 times the thermal conductivity across the layers,
  (c) an oriented graphite plate diameter substantially similar to a diameter of the rim, and
  (d) a substrate contact surface.

16. The substrate support of claim 15, wherein the support member comprises silicon carbide.

17. The substrate support of claim 16, wherein the support member comprises quartz.

* * * * *